(12) United States Patent
Ishizuya

(10) Patent No.: US 8,530,908 B2
(45) Date of Patent: Sep. 10, 2013

(54) ORGANIC EL ELEMENT

(75) Inventor: Koji Ishizuya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/458,965

(22) Filed: Apr. 27, 2012

(65) Prior Publication Data
US 2012/0286294 A1    Nov. 15, 2012

(30) Foreign Application Priority Data

May 12, 2011  (JP) ................... 2011-107385
Apr. 6, 2012   (JP) ................... 2012-087102

(51) Int. Cl.
*H01L 27/15*  (2006.01)
(52) U.S. Cl.
USPC ........... 257/80; 257/40; 257/98; 257/E33.067
(58) Field of Classification Search
USPC ............................ 257/40, 80, 88, 98, E33.067
See application file for complete search history.

(56) References Cited

U.S. PATENT DOCUMENTS

| 5,724,108 A * | 3/1998 | Shibata ........................... 349/62 |
| 2002/0008807 A1 * | 1/2002 | Miyatake et al. ............... 349/65 |
| 2005/0007793 A1 * | 1/2005 | Yoshida et al. ............... 362/558 |
| 2006/0067078 A1 * | 3/2006 | Beeson et al. ................ 362/327 |
| 2010/0046236 A1 * | 2/2010 | Nishiwaki ............... 362/311.14 |
| 2011/0133624 A1 * | 6/2011 | Wakabayashi et al. ....... 313/112 |

FOREIGN PATENT DOCUMENTS

JP     2005-055481 A     3/2005

OTHER PUBLICATIONS

Mikami et al., "High Efficiency 200-LM/W Green Light Emitting Organic Devices Prepared on High-Index of Refraction Substrate" 60.4L Late-News Paper, SID 09 Digest, p. 907-910.

* cited by examiner

*Primary Examiner* — Kimberly Rizkallah
*Assistant Examiner* — Duy T Nguyen
(74) *Attorney, Agent, or Firm* — Canon U.S.A., Inc., IP Division

(57) ABSTRACT

An organic EL element includes: an organic EL layer including a transparent electrode, a reflective electrode, and a light-emitting layer; a transparent layer disposed on a light-exiting side of the transparent electrode; and a light extraction structure disposed on a light-exiting side of the transparent layer and having a protruding shape with inclined portions. The transparent layer and the light extraction structure have a larger refractive index than the light-emitting layer. The inclined portions of the light extraction structure satisfy Condition 1 or 2 for extracting guided wave light emitted from the light-emitting layer and incident on the light extraction structure from the light extraction structure to the outside of the organic EL element, in a cross section taken along a plane perpendicular to the reflective electrode, where two inclination angles $\phi_1$ and $\phi_2$ formed between the reflective electrode and the inclined portions are the largest.

20 Claims, 9 Drawing Sheets

ORGANIC EL ELEMENT

BACKGROUND OF THE INVENTION

1. Field of the Invention

The present invention relates to organic electroluminescent (EL) elements, and more specifically, to organic EL elements that have a structure for extracting guided wave light in a front direction.

2. Description of the Related Art

In order to reduce the power consumption of organic EL elements, it is necessary to increase the emission intensity of the organic EL elements. A known method increases the emission intensity of an organic EL element by extracting light trapped in the organic EL element, due to total internal reflection, among light emitted from a light-emitting layer of the organic EL element.

FIG. 10 is a schematic cross-sectional view of an organic EL element 101 of the related art. Light entrapment due to total internal reflection will be described by referring to FIG. 10. Typically, a substrate 102 is made of glass (having a refractive index of about 1.5), a transparent electrode 106 is made of indium tin oxide (ITO) or indium zinc oxide (IZO™) (having a refractive index of about 1.9 to 2.1), and a light-emitting layer 105 inside an organic EL layer 104 is made of $Alq_3$ or the like (having a refractive index of about 1.7 to 1.9). These materials are stacked substantially in parallel. When light passes from a medium having a high refractive index to a medium having a low refractive index, total internal reflection occurs, according to Snell's law, at an incident angle exceeding the critical angle. In the organic EL element 101, roughly two total internal reflections occur.

A first total internal reflection occurs at the interface between the transparent electrode 106 and the substrate 102, because the substrate 102 has a lower refractive index than the light-emitting layer 105. Because the totally internally reflected light is transformed into propagation light 111 propagating along the surface of the substrate 102 while being repeatedly reflected by the interface between the substrate 102 and the transparent electrode 106 and the interface between the reflective electrode 103 and the organic EL layer 104, the light is trapped in the organic EL element 101. Since this propagation light 111 is not extracted to an outer area 110 (air) of the organic EL element 101, it decreases the emission intensity of the organic EL element 101. Thus, in order to increase the emission intensity, a medium having a lower refractive index than the light-emitting layer 105 should not be provided between the light-emitting layer 105 and the outer area 110.

A second total internal reflection occurs at the interface between the substrate 102 and the outer area 110, because the outer area 110 (air) has a lower refractive index than the light-emitting layer 105. Because the totally internally reflected light is transformed into propagation light 111' while being repeatedly reflected by the interface between the substrate 102 and the outer area 110 and the interface between the reflective electrode 103 and the organic EL layer 104, the light is trapped in the organic EL element 101. In order for the light emitted from the organic EL element 101 to be viewed by human eyes, the light needs to be extracted to the outer area 110. Therefore, substitution by a material having a high refractive index, as in the case of the first total internal reflection, cannot be used. Thus, in order to increase the emission intensity, it is necessary to prevent the interface between the organic EL element 101 and the outer area 110 from satisfying the total-internal-reflection condition by changing the angle of the interface between the organic EL element 101 and the outer area 110 or by causing the light to be scattered at the interface.

Akiyoshi Mikami SID '09 DIGEST P. 907 60.4 L proposes a configuration for reducing the two total internal reflections mentioned above, in which the substrate is made of a material having a higher refractive index (2.0) than the light-emitting layer so that there is no material having a lower refractive index than the light-emitting layer between the light-emitting layer and the outer area of the organic EL element, and in which spherical lenses are formed on the substrate, at the interface with respect to the outer area. According to the report, this configuration improves the efficiency of extracting light to the outside.

Japanese Patent Laid-Open No. 2005-055481 proposes a configuration for reducing the above-mentioned second total internal reflection, in which square-pyramid-shaped light extraction structures, which are three-dimensional bodies having inclined portions, are provided on the organic EL element, at the interface with respect to the outer area. The light extraction structures having the inclined portions provided on a light-exiting side of the organic EL element change the angle of the interface between the organic EL element and the outer area with respect to the guided wave light. Japanese Patent Laid-Open No. 2005-055481 improves the efficiency of extracting light to the outside by setting the angle of the inclined portions such that total internal reflection is less likely to occur.

SUMMARY OF THE INVENTION

With the configuration proposed in Akiyoshi Mikami SID '09 DIGEST P. 907 60.4 L, in which a plurality of lenses having a high refractive index are provided for a surface light source, i.e., an organic EL element, the efficiency of extracting light to the outside and the emission intensity on the high-angle side are likely to improve, whereas the emission intensity in the front direction, which is particularly important, is less likely to improve. This is because the provision of a plurality of lenses for a surface light source, such as an organic EL element, which emits light in all directions without any directivity, makes it impossible to adopt an optical design for focusing light in an intended direction.

On the other hand, in a configuration in which the size of the light-emitting region of an organic EL element is sufficiently reduced relative to the lenses so that the organic EL element serves as a point light source, the emission intensity in the front direction can be increased by adopting an optimum lens design for the point light source. However, the smaller the size of the light-emitting region, the larger the density of current required by the organic EL element to emit light, increasing the degradation rate of the emission intensity of the organic EL element.

Furthermore, in a configuration in which light extraction structures having inclined portions, as disclosed in Japanese Patent Laid-Open No. 2005-055481, are made of a material having a higher refractive index than the light-emitting layer, as in Akiyoshi Mikami SID '09 DIGEST P.907 60.4 L, the emission intensity in the front direction was not always increased. That is, just setting the angle of the inclined portions of the light extraction structures to an optimum value was not always sufficient to extract a large quantity of propagation light in the front direction.

The present invention provides an organic EL element that achieves increased emission intensity in the front direction without reducing the size of the light-emitting region thereof, by providing a structure for extracting a large quantity of propagation light in the front direction.

The present invention provides an organic EL element including: an organic EL layer including a transparent electrode, a reflective electrode, and a light-emitting layer disposed between the transparent electrode and the reflective electrode; a transparent layer disposed on a light-exiting side of the transparent electrode; and a light extraction structure disposed on a light-exiting side of the transparent layer and having a protruding shape with inclined portions that are gradually narrowing from the transparent layer side. The transparent layer and the light extraction structure have a larger refractive index than the light-emitting layer. The inclined portions of the light extraction structure are designed so as to satisfy Condition 1 or 2 for extracting guided wave light emitted from the light-emitting layer and incident on the light extraction structure from the light extraction structure to the outside of the organic EL element, in a cross section taken along a plane perpendicular to the reflective electrode, where two inclination angles $\phi_1$ and $\phi_2$ formed between the reflective electrode and the inclined portions are the largest. Conditions 1 and 2 are specified below.

The present invention enables a large quantity of propagation light to be extracted in the front direction, regardless of the size of the light-emitting region of the organic EL element. Accordingly, the emission intensity in the front direction of the organic EL element can be increased.

Further features of the present invention will become apparent from the following description of exemplary embodiments with reference to the attached drawings.

DESCRIPTION OF THE EMBODIMENTS

Embodiments of an organic EL element of the present invention will be described with reference to the drawings. Note that parts not illustrated or described in this disclosure use a technique known in the art or a publicly known technique. The present invention is not limited to the embodiments described below.

Figure 1:
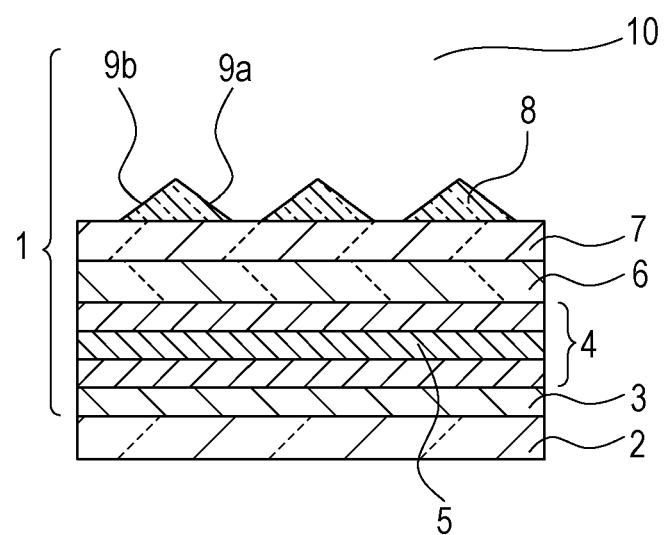
FIG. 1 is a schematic cross-sectional view of an organic EL element of the present invention.

FIG. 1 is a schematic cross-sectional view of an organic EL element 1 of the present invention. The organic EL element 1 includes, in sequence from an inner surface side of a transparent layer 7, a transparent electrode 6, an organic EL layer (organic compound layer) 4 including a light-emitting layer 5, a reflective electrode 3, and a light extraction structure 8 disposed on an outer surface side of the transparent layer 7. In this disclosure, a surface of the transparent layer 7 on the light-emitting layer side is referred to as an "inner surface of the transparent layer 7", and a surface of the transparent layer 7 on the opposite side to the light-emitting layer, i.e., a surface of the transparent layer 7 on the light-exiting side, is referred to as an "outer surface of the transparent layer 7". The substrate 2 is made of glass, plastic, silicon, or the like. The substrate 2 may be provided with a switching device (not shown), such as a thin film transistor (TFT). The reflective electrode 3 that reflects light emitted from the organic EL element 1 toward the light-exiting side is provided on the substrate 2. The reflective electrode 3 is desirably made of a metal having a high reflectivity or an alloy thereof; Al, Ag, Pt, Au, Cu, Pd, Ni, etc., are particularly suitable. The reflective electrode 3 may be a layered body in which an oxide transparent conducting material having a high work function, such as ITO or IZO™, is stacked on top of the aforementioned metal or the alloy thereof.

The organic EL layer 4 including, at least, the light-emitting layer 5 is formed on the reflective electrode 3. The organic EL layer 4 may include a hole injection layer, a hole transport layer, an electron blocking layer, a hole blocking layer, an electron transport layer, an electron injection layer, etc., in addition to the light-emitting layer 5. These layers may be made of known organic EL materials.

The transparent electrode 6 having a higher refractive index than the light-emitting layer 5 is formed on the organic EL layer 4. The transparent electrode 6 is desirably made of a material having a low light absorption and a high transmittance; an oxide transparent conducting material, such as ITO or IZO™, is particularly suitable.

The transparent layer 7 having a higher refractive index than the light-emitting layer 5 is formed on the transparent electrode 6. The transparent layer 7 is desirably made of a material having a low light absorption and a high transmittance; an inorganic nitride, such as silicon nitride (SiN) or titanium nitride (TiN), an inorganic oxide, such as titanium oxide ($TiO_2$), zinc oxide (ZnO), aluminum oxide ($Al_2O_3$), zirconium oxide (ZrO), indium tin oxide (ITO), or indium zinc oxide (IZO™), or an organic material, such as $Alq_3$ or αNPD, is particularly suitable. The transparent layer 7 may be made of the same material as the transparent electrode 6, or it may be a layered body made of materials having higher refractive indices than the light-emitting layer 5. The transparent layer 7 may also serve as a protection layer, or it may also serve as the transparent electrode 6 by employing an oxide transparent conducting layer.

The light extraction structure 8 having a higher refractive index than the light-emitting layer 5 is formed on the transparent layer 7. The light extraction structure 8 is desirably made of a material having a low light absorption and a high transmittance; an inorganic nitride, such as SiN or TiN, an inorganic oxide, such as $TiO_2$, ZnO, $Al_2O_3$, ZrO, ITO, or IZO™, or an organic material, such as $Alq_3$ or αNPD, is particularly suitable. Furthermore, the light extraction structure 8 may be made of the same material as the transparent electrode 6 or the transparent layer 7.

The light extraction structure 8 includes inclined portions 9a and 9b that are not parallel to the reflective electrode 3. In other words, the light extraction structure 8 is protruding and has the inclined portions 9a and 9b that are gradually narrowing from the transparent layer side. More specifically, the light extraction structure 8 has desirably a triangular shape in cross section taken along a surface perpendicular to the reflective electrode 3. The number of the light extraction structures 8 may be either one or more than one.

The outer side of the inclined portions of the light extraction structure 8, that is, an outer area 10 of the organic EL element 1, is desirably made of a material having a low refractive index than the light extraction structure 8; gas, such as air or nitrogen, an organic material, such as acrylic resin or polyimide resin, or an inorganic oxide, such as silicon oxide ($SiO_2$), is particularly suitable.

In the organic EL element in FIG. 1, light exits from the outer surface of the transparent layer 7 and the inclined portions 9a and 9b of the light extraction structure 8, and the substrate 2, the reflective electrode 3, the organic EL layer 4, the light-emitting layer 5, the transparent electrode 6, and the transparent layer 7 are stacked in parallel.

Next, referring to FIGS. 2A and 2B, two mechanisms for increasing the emission intensity in the front direction of the organic EL element of the present invention will be described. These mechanisms are characterized in that guided wave light 11 in the organic EL element 1, after being totally internally reflected by the interface between the light extraction structure 8 and the outer area 10, is reflected by the reflective electrode 3 and extracted in the front direction. The "front direction" herein means the direction perpendicular to the reflective electrode 3 and oriented from the reflective electrode 3 toward the light-exiting side.

Figure 2A:
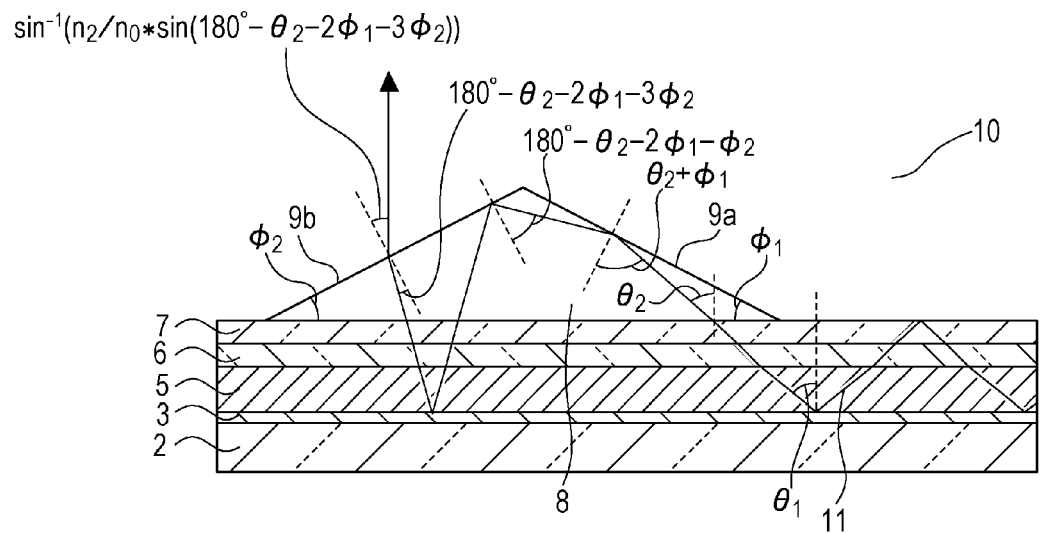
FIGS. 2A and 2B illustrate a mechanism for increasing the emission intensity in the front direction of the organic EL element.

FIG. 2A illustrates a "three reflection mode", which is a first front-emission-intensity (emission intensity in the front direction) increasing mechanism of the organic EL element of the present invention. In the "three reflection mode", the guided wave light 11 in the organic EL element 1 is reflected twice by the interface between the light extraction structure 8 and the outer area 10 and is then reflected by the reflective electrode 3, thereby being extracted in the front direction of the organic EL element 1. FIG. 2A is a cross-sectional view taken along a surface perpendicular to the reflective electrode 3, where the inclination angle $\phi_1$ formed between the reflective electrode 3 and the extension of the inclined portion 9a of the light extraction structure 8 and the inclination angle $\phi_2$ formed between the reflective electrode 3 and the extension of the inclined portion 9b are the largest. Illustration of the organic EL layer is omitted in FIG. 2A.

As shown in FIG. 2A, among the light emitted from the light-emitting layer 5, the light that satisfies the total-internal-reflection condition due to the refractive index of the light-emitting layer 5, $n_1$, and the refractive index of the outer area 10, $n_0$, is guided in the layer between the transparent layer 7 and the reflective electrode 3, while being repeatedly reflected by the reflective electrode 3 and the interface between the transparent layer 7 and the outer area 10. The angle, $\theta_1$, formed between the guided wave light 11 and the normal to the reflective electrode 3 is in a range expressed by Formula 1-1.

$$\sin^{-1}\left(\frac{n_0}{n_1}\right) \leq \theta_1 \leq 90° \qquad \text{Formula 1-1}$$

When the guided wave light 11 is incident on the light extraction structure 8, the angle, $\theta_2$, formed between the guided wave light 11 and the normal to the reflective electrode 3 in the light extraction structure 8, is expressed by Formula 1-2, using the refractive index of the light-emitting layer 5, $n_1$, the angle $\theta_1$, and the refractive index of the light extraction structure 8, $n_2$, according to Snell's law.

$$n_1 \sin \theta_1 = n_2 \sin \theta_2 \qquad \text{Formula 1-2}$$

In order for the light incident on the light extraction structure 8 to be totally internally reflected by the inclined portion 9a, the refractive index of the light extraction structure 8, $n_2$, the refractive index of the outer area 10, $n_0$, and the inclination angle $\phi_1$ need to satisfy the condition of Formula 1-3.

$$\sin(\theta_2 + \phi_1) \geq \frac{n_0}{n_2} \qquad \text{Formula 1-3}$$

The guided wave light 11, which has been totally internally reflected by the inclined portion 9a, is directed toward the inclined portion 9b. The guided wave light 11 is incident on the inclined portion 9b, at an angle of $180°-\theta_2-2\phi_1-\phi_2$ with respect to the normal thereof. In order for the guided wave light 11 to be totally internally reflected by the interface between the inclined portion 9b and the outer area 10, the refractive index of the light extraction structure 8, $n_2$, the refractive index of the outer area 10, $n_0$, and the inclination angles $\phi_1$ and $\phi_2$ need to satisfy the condition of Formula 1-4.

$$\sin(180° - \theta_2 - 2\phi_1 - \phi_2) \geq \frac{n_0}{n_2} \qquad \text{Formula 1-4}$$

The guided wave light 11, which has been totally internally reflected by the inclined portion 9b, is directed toward the reflective electrode 3. The guided wave light 11 is then reflected by the reflective electrode 3 and is directed toward the inclined portion 9b. The guided wave light 11 is incident on the inclined portion 9b, at an angle of $180°-\theta_2-2\phi_1-3\phi_2$ with respect to the normal thereof. Although the guided wave light 11 refracts at the interface between the light extraction structure 8 and the transparent layer 7, the guided wave light 11 exits the light extraction structure 8 and returns to the light extraction structure 8. Therefore, this refraction does not affect the angle of the guided wave light 11 incident on the inclined portion 9b after being reflected by the reflective electrode 3.

In order for the guided wave light 11 to pass the interface between the inclined portion 9b and the outer area 10 into the outer area 10, the guided wave light 11 needs to be prevented from being totally internally reflected at the interface between the inclined portion 9b and the outer area 10. Thus, the refractive index of the light extraction structure 8, $n_2$, the refractive index of the outer area 10, $n_0$, and the inclination angles $\phi_1$ and $\phi_2$ need to satisfy the condition of Formula 1-5.

$$-\frac{n_0}{n_2} < \sin(180° - \theta_2 - 2\phi_1 - 3\phi_2) < \frac{n_0}{n_2} \qquad \text{Formula 1-5}$$

The guided wave light 11 extracted into the outer area 10 advances at an angle of $\sin^{-1}((n_2/n_0)\cdot\sin(180°-\theta_2-2\phi_1-3\phi_2))$ with respect to the normal to the inclined portion 9b. In order for the guided wave light 11 to be extracted in the front direction of the organic EL element 1, the refractive index of the light extraction structure 8, $n_2$, the refractive index of the outer area 10, $n_0$, and the inclination angles $\phi_1$ and $\phi_2$ need to satisfy the condition of Formula 1-6.

$$\sin^{-1}\left(\frac{n_2}{n_0}\sin(180° - \theta_2 - 2\phi_1 - 3\phi_2)\right) + \phi_2 = 0 \qquad \text{Formula 1-6}$$

As has been described, in the "three reflection mode", the guided wave light 11 can be extracted in the front direction of the organic EL element 1 by satisfying all the Formulae 1-1 to 1-6, and the emission intensity in the front direction can be increased. Hereinbelow, to satisfy all the Formulae 1-1 to 1-6 is referred to as to satisfy Condition 1. In the present invention, the refractive index of the light extraction structure 8, $n_2$, and the inclination angles $\phi_1$ and $\phi_2$ are designed so as to satisfy Condition 1 or Condition 2 specified below. That is, at least one of Condition 1 and Condition 2 is satisfied.

Furthermore, the first front-emission-intensity increasing mechanism is a phenomenon that occurs in one light extraction structure 8, not in a plurality of light extraction structures 8. That is, the guided wave light 11 that has been totally internally reflected by the inclined portion 9b and the reflective electrode 3 is not extracted from the inclined portions 9a and 9b of the adjacent light extraction structure 8 into the outer area 10. In other words, to satisfy Condition 1 means that the above-described mechanism occurs in only one light extraction structure 8. Accordingly, in the optical design for increasing the emission intensity in the front direction, only the refractive index $n_2$ and inclination angles $\phi_2$ and $\phi_2$ of one light extraction structure 8 need to be determined, and thus, the optical design is simplified.

Figure 2B:
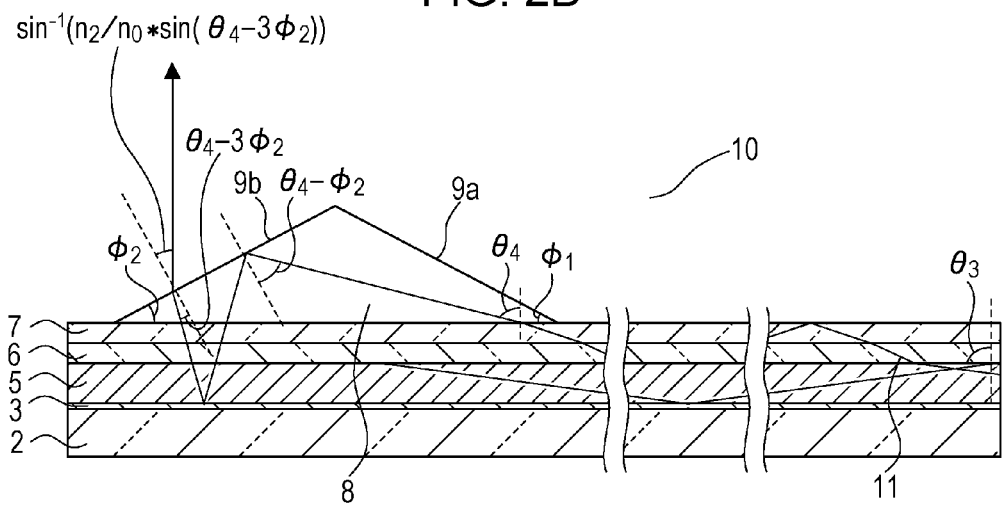

FIG. 2B illustrates a "two reflection mode", which is a second front-emission-intensity increasing mechanism of the organic EL element of the present invention. In the "two reflection mode", the guided wave light 11 in the organic EL element 1 is reflected once by the interface between the light extraction structure 8 and the outer area 10 and is then reflected by the reflective electrode 3, thereby being extracted in the front direction of the organic EL element 1. FIG. 2B is a cross-sectional view taken along a surface perpendicular to the reflective electrode 3, where the inclination angle $\phi_2$ formed between the reflective electrode 3 and the extension of the inclined portion 9a of the light extraction structure 8 and the inclination angle $\phi_2$ formed between the reflective electrode 3 and the extension of the inclined portion 9b are the largest. Illustration of the organic EL layer is omitted in FIG. 2B.

As shown in FIG. 2B, among the light emitted from the light-emitting layer 5, the light that satisfies the total-internal-reflection condition due to the refractive index of the light-emitting layer 5, $n_1$, and the refractive index of the outer area 10, $n_0$, is guided in the layer between the transparent layer 7 and the reflective electrode 3, while being repeatedly reflected by the reflective electrode 3 and the interface between the transparent layer 7 and the outer area 10. The angle, $\theta_3$, formed between the guided wave light 11 and the normal to the reflective electrode 3 is in a range expressed by Formula 2-1.

$$\sin^{-1}\left(\frac{n_0}{n_1}\right) \leq \theta_3 \leq 90° \qquad \text{Formula 2-1}$$

When the guided wave light 11 is incident on the light extraction structure 8, the angle, $\theta_4$, formed between the guided wave light 11 and the normal to the reflective electrode 3 in the light extraction structure 8 is expressed by Formula 2-2, using the refractive index of the light-emitting layer 5, $n_1$, the refractive index of the light extraction structure 8, $n_2$, and the angle $\theta_3$, according to Snell's law.

$$n_1 \sin\theta_3 = n_2 \sin\theta_4 \qquad \text{Formula 2-2}$$

The guided wave light 11 is incident on the inclined portion 9b, at an angle of $\theta_4 - \phi_2$ with respect to the normal thereof. In order for the guided wave light 11 to be totally internally reflected by the interface between the inclined portion 9b and the outer area 10, the refractive index of the light extraction structure 8, $n_2$, the refractive index of the outer area 10, $n_0$, the angle $\theta_4$, and the inclination angle $\phi_2$ need to satisfy the condition of Formula 2-3.

$$\sin(\theta_4 - \phi_2) \geq \frac{n_0}{n_2} \qquad \text{Formula 2-3}$$

The guided wave light 11, which has been totally internally reflected by the inclined portion 9b, is directed toward the reflective electrode 3. The guided wave light 11 is then reflected by the reflective electrode 3 and is directed toward the inclined portion 9b. The guided wave light 11 is incident on the inclined portion 9b, at an angle of $\theta_4 - 3\phi_2$ with respect to the normal thereof. In order for the guided wave light 11 to pass the interface between the inclined portion 9b and the outer area 10 into the outer area 10, the guided wave light 11 needs to be prevented from being totally internally reflected at the interface between the inclined portion 9b and the outer area 10. Thus, the refractive index of the light extraction structure 8, $n_2$, the refractive index of the outer area 10, $n_0$, the angle $\theta_4$, and the inclination angle $\phi_2$ need to satisfy the condition of Formula 2-4.

$$-\frac{n_0}{n_2} < \sin(\theta_4 - 3\phi_2) < \frac{n_0}{n_2} \qquad \text{Formula 2-4}$$

The guided wave light 11 extracted into the outer area 10 advances at an angle of $\sin^{-1}((n_2/n_0)\cdot\sin(\theta_4 - 3\phi_2))$ with respect to the normal to the inclined portion 9b. In order for the guided wave light 11 to be extracted in the front direction of the organic EL element 1, the refractive index of the light extraction structure 8, $n_2$, the refractive index of the outer area 10, $n_0$, the angle $\theta_4$, and the inclination angle $\phi_2$ need to satisfy the condition of Formula 2-5.

$$\sin^{-1}\left(\frac{n_2}{n_0}\sin(\theta_4 - 3\phi_2)\right) + \phi_2 = 0 \qquad \text{Formula 2-5}$$

As has been described, in the "two reflection mode", the guided wave light 11 can be extracted in the front direction of the organic EL element 1 by satisfying all the Formulae 2-1 to 2-5, and the emission intensity in the front direction can be increased. Hereinbelow, to satisfy all the Formulae 2-1 to 2-5 is referred to as to satisfy Condition 2. In the present invention, the refractive index of the light extraction structure 8, $n_2$, and the inclination angles $\phi_1$ and $\phi_2$ are designed so as to satisfy Condition 1 or Condition 2. The second front-emission-intensity increasing mechanism is a phenomenon that occurs in one light extraction structure 8, not in a plurality of light extraction structures 8. In other words, to satisfy Condition 2 means that the above-described mechanism occurs in only one light extraction structure 8. Accordingly, in the optical design for increasing the emission intensity in the front direction, only the refractive index $n_2$ and inclination angles $\phi_1$ and $\phi_2$ of one light extraction structure 8 need to be determined, and thus, the optical design is simplified.

The emission intensity in the front direction of the organic EL element of the present invention can be significantly increased by employing the configuration that satisfies the above-described Condition 1 or 2 for increasing the front emission intensity. Furthermore, the organic EL element of the present invention is configured to satisfy Condition 1 or 2 at the cross section where the inclination angles $\phi_1$ and $\phi_2$ are the largest. This is because the light extraction structure 8, no matter what shape it is in, has such a cross section that the inclination angles $\phi_1$ and $\phi_2$ are the largest, and, by employing the structure that enables the guided wave light 11 to be extracted in the front direction at that cross section, a large quantity of the guided wave light 11 can be extracted in the front direction. The angles $\theta_1$ and $\theta_3$ formed between the guided wave light 11 and the reflective electrode 3 in the light-emitting layer may be either the same or different.

In the case where the light extraction structure 8 is provided on the outer surface side (light-exiting side of the light-emitting region) of the transparent layer 7 in the light-emitting region, the guided wave light 11 is guided to the light extraction structure 8, from both the direction of the inclined portion 9a and the direction of the inclined portion 9b. Accordingly, by making the inclination angles $\phi_1$ and $\phi_2$ equal, the guided wave light 11 can be extracted in the front direction at both the inclined portion 9a and the inclined portion 9b. That is, a larger quantity of the guided wave light 11 can be extracted in the front direction. Thus, in the case where the light extraction structure 8 is provided at least on the outer surface side of the transparent layer 7 in the light-emitting region and in the case where the inclination angles $\phi_1$ and $\phi_2$ of the light extraction structure 8 are equal, the emission intensity in the front direction can be further increased. Accordingly, if the light extraction structure 8 is located above the light-emitting region, desirably, the inclination angles $\phi_1$ and $\phi_2$ of the light extraction structure 8 are made equal. In the case where the inclination angles $\phi_1$ and $\phi_2$ of the light extraction structure 8 are equal, it is desirable that the inclination angles $\phi_1$ and $\phi_2$ be in the range shown in Table 1, according to the refractive index of the light-emitting layer, $n_1$, and the refractive index of the light extraction structure, $n_2$. The refractive index of the outer area 10 is 1.0. Preferred shapes of the light extraction structure 8 include a conic solid, a frustum, and a prism.

In the case where the light extraction structure 8 is located above the light-emitting region and the inclination angles $\phi_1$ and $\phi_2$ are equal, under the condition in which the refractive index of the light extraction structure 8, $n_2$, is larger than or equal to the refractive index of the light-emitting layer 5, $n_1$ (i.e., $n_2 \geq n_1$), the inclination angles $\phi_1$ and $\phi_2$ are desirably in the range of 22° to 32°, and more desirably, in the range of 25° to 28°. Furthermore, the refractive index of the light-emitting layer 5, $n_1$, is in the range of 1.7 to 1.9, and the refractive index of the light extraction structure 8, $n_2$, is in the range of 1.7 to 2.0.

TABLE 1

| REFRACTIVE INDEX OF LIGHT-EMITTING LAYER | REFRACTIVE INDEX OF LIGHT EXTRACTION STRUCTURE | INCLINATION ANGLE OF INCLINED PORTION 9a, 9b |
|---|---|---|
| 1.70 | 1.70 | 24°-32° |
| 1.70 | 1.80 | 25°-28° |
| 1.80 | 1.80 | 24°-32° |
| 1.80 | 1.90 | 25°-28° |
| 1.90 | 1.90 | 22°-32° |
| 1.90 | 2.00 | 24°-28° |

The refractive index of the light extraction structure 8, $n_2$, and the inclination angles $\phi_1$ and $\phi_2$ are desirably designed so as to satisfy Condition 2, rather than Condition 1. The reason for this will be described below. Typically, because the solid angle increases as the angle of radiation from the light-emitting layer increases, the light intensity at that angle of radiation increases. Furthermore, the angle of radiation $\theta_1$ that satisfies Condition 2 is larger than the angle of radiation $\theta_1$ that satisfies Condition 1. Accordingly, satisfying Condition 2 enables a larger quantity of light to be extracted in the front direction than satisfying Condition 1 and, thus, has a larger effect of increasing the emission intensity in the front direction.

In the case where the light extraction structure 8 is provided only on the outer surface side of the transparent layer 7 outside the light-emitting region, the light not totally internally reflected at the interface between the transparent layer 7 and the outer area 10 can be extracted in the light-emitting region, and the guided wave light 11 totally internally reflected in the light-emitting region can be extracted outside the light-emitting region. Thus, this configuration can also increase the emission intensity in the front direction, because the guided wave light 11 can be extracted in the front direction. Because this configuration makes it possible to provide the light extraction structure 8 only on the outer surface side of the transparent layer 7 outside the light-emitting region in, for example, a display including a plurality of light-emitting regions, the size of the region over which the light extraction structure 8 is formed can be reduced. Moreover, because the light extraction structure 8 is not disposed on the light-emitting region, the light radiated from the light-emitting region in the front direction is less likely to be emitted in directions other than the front direction due to the light extraction structure 8, when emitted from the organic EL element 1, and hence, the emission intensity in the front direction can be further increased.

The inclination angles $\phi_1$ and $\phi_2$ of the light extraction structure 8 are desirably different if the light extraction structure 8 is provided only on the outer surface side of the transparent layer 7 outside the light-emitting region. Because Conditions 1 and 2 are satisfied by differentiating the inclination angles $\phi_1$ and $\phi_2$, the emission intensity in the front direction increases. The inclination angle $\phi_1$ is closer to the light-emitting region and the inclination angle $\phi_2$ is farther from the light-emitting region.

In the case where the light extraction structure 8 is provided on the outer surface side of the transparent layer 7 outside the light-emitting region so as to surround the outer periphery of the light-emitting region, the guided wave light 11 totally internally reflected in the light-emitting region is more likely to be incident on the light extraction structure 8. Therefore, a larger quantity of the guided wave light 11 can be extracted in the front direction. Accordingly, with this configuration, the emission intensity in the front direction can be further increased. It is either possible that one light extraction structure 8 surrounds the outer periphery of the light-emitting region in a single layer or that a plurality of light extraction structures 8 surround the outer periphery of the light-emitting region.

In the case where the light extraction structure 8 is provided only on the outer surface side of the transparent layer 7 outside the light-emitting region, or in the case where the light extraction structure 8 is provided on the outer surface side so as to surround the outer periphery of the light-emitting region, it is desirable that the inclination angle $\phi_2$ of the light extraction structure 8 be on the light-emitting region side and the inclination angle $\phi_2$ be on the opposite side of the light-emitting region side. In the case where the inclination angle $\phi_2$ of the light extraction structure 8 is set to 24°, 26°, 28°, 30°, and 32°, it is desirable that the inclination angle $\phi_2$ be in the range shown in Table 2, according to the refractive index of the light-emitting layer, $n_2$, and the refractive index of the light extraction structure, $n_2$. The refractive index of the outer area 10 is 1.0.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_1$), and when the inclination angle $\phi_2$ is in the range of 24° to 32°, the inclination angle $\phi_2$ is desirably in the range of 11° to 45°. Furthermore, the refractive index of the light-emitting layer 5, $n_2$, is in the range of 1.7 to 1.9, and the refractive index of the light extraction structure 8, $n_2$, is in the range of 1.7 to 2.1.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_2$), and when the inclination angle $\phi_2$ is in the range of 24° to 30°, the inclination angle $\phi_1$ is desirably in the range of 16° to 45°, and more desirably, in the range of 32° to 35°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_2$), and when the inclination angle $\phi_2$ is in the range of 24° to 28°, the inclination angle $\phi_1$ is desirably in the range of 20° to 45°, and more desirably, in the range of 32° to 38°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_2$), and when the inclination angle $\phi_2$ is in the range of 24° to 26°, the inclination angle $\phi_1$ is desirably in the range of 25° to 45°, and more desirably, in the range of 32° to 40°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_2$), and when the inclination angle $\phi_2$ is in the range of 26° to 32°, the inclination angle $\phi_1$ is desirably in the range of 11° to 42°, and more desirably, in the range of 27° to 33°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_1$), and when the inclination angle $\phi_2$ is in the range of 26° to 30°, the inclination angle $\phi_1$ is desirably in the range of 16° to 42°, and more desirably, in the range of 27° to 35°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_1$), and when the inclination angle $\phi_2$ is in the range of 26° to 28°, the inclination angle $\phi_1$ is desirably in the range of 20° to 42°, and more desirably, in the range of 27° to 38°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_1$ (i.e., $n_2 \geq n_1$), and when the inclination angle $\phi_2$ is in the range of 28° to 32°, the inclination angle $\phi_1$ is desirably in the range of 11° to 39°, and more desirably, in the range of 23° to 33°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_1$ (i.e., $n_2 \geq n_1$), and when the inclination angle $\phi_2$ is in the range of 28° to 30°, the inclination angle $\phi_2$ is desirably in the range of 16° to 39°, and more desirably, in the range of 23° to 35°.

In the case where the light extraction structure 8 is provided only on the outer surface side of the transparent layer 7 outside the light-emitting region or where the light extraction structure 8 is provided on the outer surface side so as to surround the outer periphery of the light-emitting region, under the condition in which the refractive index of the light extraction structure 8, $n_2$, is larger than or equal to the refractive index of the light-emitting layer 5, $n_2$ (i.e., $n_2 \geq n_1$), and when the inclination angle $\phi_2$ is in the range of 30° to 32°, the inclination angle $\phi_1$ is desirably in the range of 11° to 36°, and more desirably, in the range of 18° to 33°.

In the case where the light extraction structure 8 is provided only on the outer surface side of the transparent layer 7 outside the light-emitting region or where the light extraction structure 8 is provided on the outer surface side so as to surround the outer periphery of the light-emitting region, when the inclination angle $\phi_2$ is 24°, the inclination angle $\phi_1$ is desirably in the range of 30° to 45°, and more desirably, in the range of 32° to 43°. When the inclination angle $\phi_2$ is 26°, the inclination angle $\phi_2$ is desirably in the range of 25° to 42°, and more desirably, in the range of 27° to 40°. When the inclination angle $\phi_2$ is 28°, the inclination angle $\phi_1$ is desirably in the range of 20° to 39°, and more desirably, in the range of 23° to 38°. When the inclination angle $\phi_2$ is 30°, the inclination angle $\phi_1$ is desirably in the range of 16° to 36°, and more desirably, in the range of 18° to 35°. When the inclination angle $\phi_2$ is 32°, the inclination angle $\phi_1$ is desirably in the range of 11° to 34°, and more desirably, in the range of 13° to 33°.

TABLE 2

| REFRACTIVE INDEX OF LIGHT-EMITTING LAYER | REFRACTIVE INDEX OF LIGHT EXTRACTION STRUCTURE | INCLINATION ANGLE OF INCLINED PORTION 9a | INCLINATION ANGLE OF INCLINED PORTION 9b |
|---|---|---|---|
| 1.70 | 1.80 | 32°-43° | 24° |
| 1.70 | 1.90 | 31°-44° | |
| 1.80 | 1.80 | 32°-43° | |
| 1.80 | 1.90 | 31°-44° | |
| 1.80 | 2.00 | 30°-44° | |
| 1.90 | 1.90 | 31°-44° | |
| 1.90 | 2.00 | 30°-44° | |
| 1.90 | 2.10 | 30°-45° | |
| 1.70 | 1.70 | 27°-40° | 26° |
| 1.70 | 1.80 | 27°-41° | |
| 1.80 | 1.80 | 27°-41° | |
| 1.80 | 1.90 | 26°-41° | |
| 1.90 | 1.90 | 26°-41° | |
| 1.90 | 2.00 | 25°-42° | |
| 1.70 | 1.70 | 23°-38° | 28° |
| 1.70 | 1.80 | 22°-38° | |
| 1.80 | 1.80 | 22°-38° | |
| 1.80 | 1.90 | 21°-39° | |
| 1.90 | 1.90 | 21°-39° | |
| 1.90 | 2.00 | 20°-39° | |
| 1.70 | 1.70 | 18°-35° | 30° |
| 1.80 | 1.80 | 17°-36° | |
| 1.90 | 1.90 | 16°-36° | |
| 1.70 | 1.70 | 13°-33° | 32° |
| 1.80 | 1.80 | 12°-33° | |
| 1.90 | 1.90 | 11°-34° | |

In the organic EL element of the present invention, the proportion of the thickness of the transparent layer 7 to the height of the light extraction structure 8 is desirably 2.0 or less, and more desirably, 1.0 or less. This is because, as the thickness of the transparent layer 7 decreases relative to the height of the light extraction structure 8, the guided wave light 11 is more likely to be incident on the light extraction structure 8, enabling a larger quantity of the guided wave light 11 to be extracted in the front direction. Accordingly, for increased emission intensity in the front direction, the transparent layer 7 desirably has a smaller thickness relative to the height of the light extraction structure 8.

The organic EL element of the present invention may be used in light-emitting apparatuses, such as lighting equipment and exposure light sources. The light-emitting apparatus having the organic EL element of the present invention may be used in an image forming apparatus, such as a printer, and such an image forming apparatus includes a photosensitive body exposed by the light-emitting apparatus. An array of a plurality of organic EL elements of the present invention may be used in the display of an image display apparatus, such as a television, and the display or the viewfinder of an image pickup apparatus having an image pickup device. Such an array may also be used in portable information terminals, such as portable telephones, smart phones, and tablet devices. In the case where the organic EL element of the present invention is used in those electronic devices, the electronic devices also have a control circuit for controlling the emission of the organic EL element, separately from the organic EL element.

EXAMPLES

Ray tracing simulation using Monte Carlo method was performed on the organic EL element of the present invention to evaluate the emission intensity in the front direction and the efficiency of extracting light to the outside. To evaluate the emission intensity of the organic EL element, a light detector was disposed at a position 30 cm away from the organic EL element.

Example 1

Figure 3A:
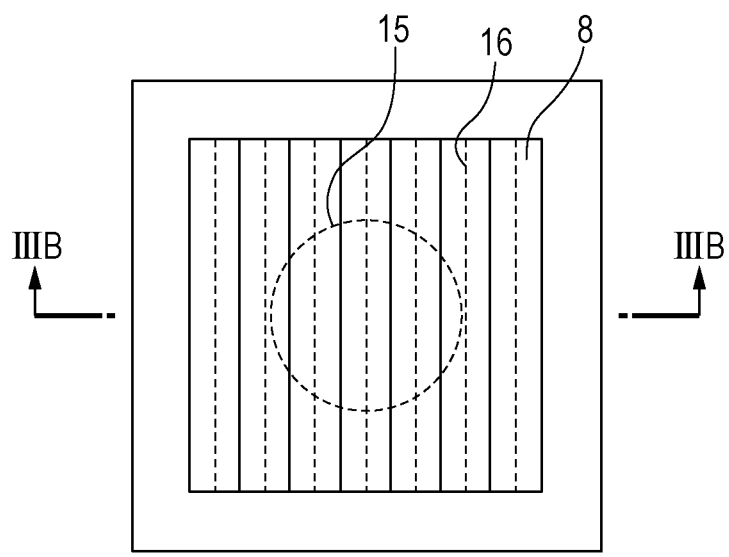
FIGS. 3A and 3B are schematic diagrams of an organic EL element of Example 1.
Figure 3B:
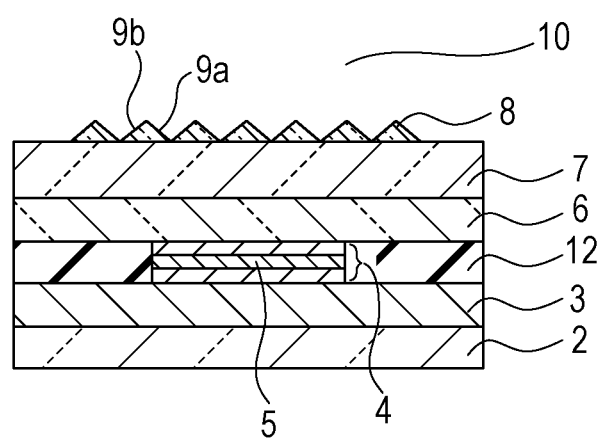

FIGS. 3A and 3B are schematic diagrams of an organic EL element of this example. FIG. 3A is a schematic plan view of the organic EL element viewed from the front, and FIG. 3B is a schematic cross-sectional view of the organic EL element, taken along a plane including a line segment IIIB in FIG. 3A.

In this example, simulation was performed by using the following simulation model. The simulation model of this example satisfies the above-described conditions (i.e., at least one of Condition 1 and Condition 2) of the present invention. The details of the reflective electrode 3, organic EL layer 4, light-emitting layer 5, transparent layer 7, light extraction structures 8, and outer area 10 of this example are as follows:

The reflective electrode 3 has a reflectivity of 95%;

The organic EL Layer 4 has a thickness of 0.1 μm, a refractive index of 1.85, and no absorption;

The light-emitting layer 5 has a refractive index of 1.85, and no absorption. By utilizing the middle portion of the organic EL layer 4 in the thickness direction as the light-emitting layer 5, and by providing an insulating layer 12 around the light-emitting layer 5, the diameter of a light-emitting region 15 is set to 27 μm;

The transparent electrode 6 has a thickness of 0.1 μm, a refractive index of 2.00, and an absorption of 1%/μm;

Transparent layer 7 has a thickness of 0.9 μm, a refractive index of 1.95, and an absorption of 1%/μm;

The light extraction structures 8 each have a prism shape with a straight ridge 16, where the height of the light extraction structure 8 is the largest, have a refractive index of 1.95, and an absorption of 1%/μm. The width of the base in the cross section where the inclination angles $\phi_1$ and $\phi_2$ are the largest is 10.0 μm. The light extraction structures 8 each have an inclination angle $\phi_1$ of 25° and an inclination angle $\phi_2$ of 25°; and The outer area 10 has a refractive index of 1.0.

Example 2

Figure 4A:
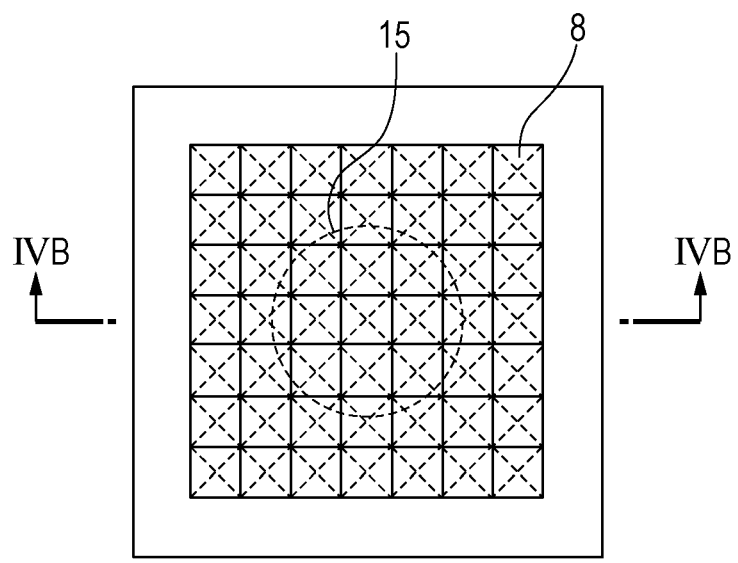
FIGS. 4A and 4B are schematic diagrams of an organic EL element of Example 2.
Figure 4B:
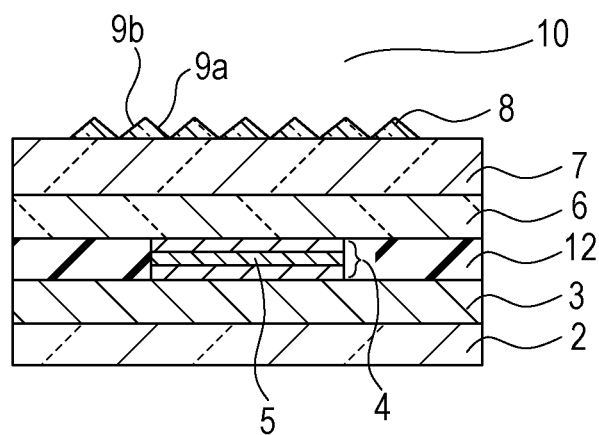

FIGS. 4A and 4B are schematic diagrams of an organic EL element of this example. FIG. 4A is a schematic plan view of the organic EL element viewed from the front, and FIG. 4B is a schematic cross-sectional view of the organic EL element, taken along a plane including a line segment IVB in FIG. 4A.

The organic EL element of this example differs from that of Example 1 in that the transparent layer 7 has a refractive index of 1.85, and the light extraction structures 8 have a square-pyramid shape whose one side of the base has a length of 10 μm, and have a refractive index of 1.85. Other than these points, the organic EL element of this example is made of the same material as Example 1 and has the same configuration as Example 1. The simulation model of this example satisfies the above-described conditions of the present invention.

Example 3

Figure 5A:
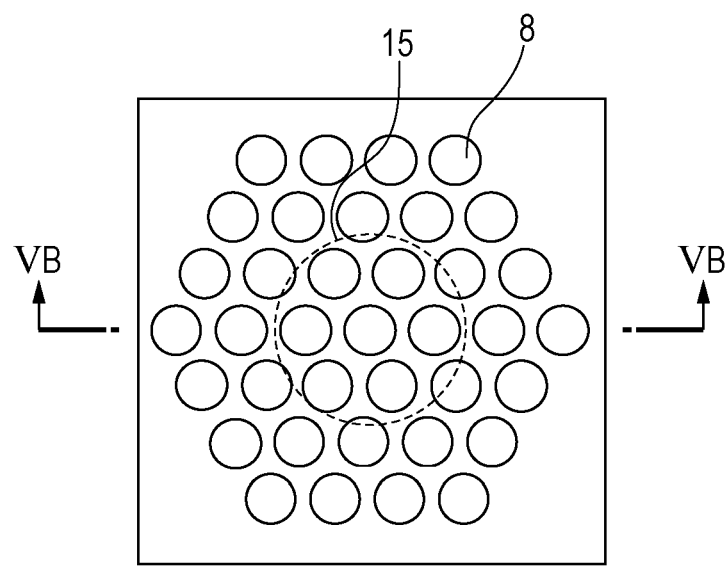
FIGS. 5A and 5B are schematic diagrams of an organic EL element of Examples 3 and 4.
Figure 5B:
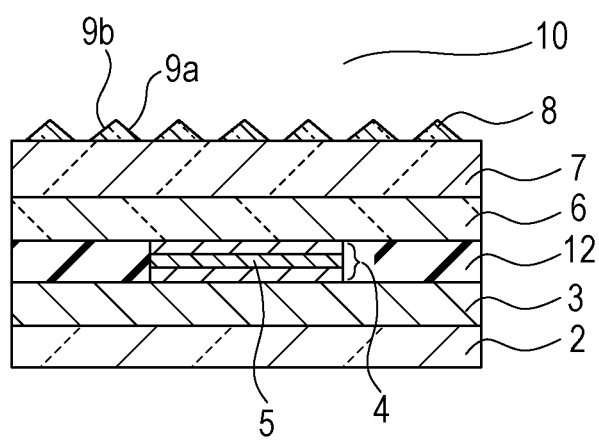

FIGS. 5A and 5B are schematic diagrams of an organic EL element of this example. FIG. 5A is a schematic plan view of the organic EL element viewed from the front, and FIG. 5B is a schematic cross-sectional view of the organic EL element, taken along a plane including a line segment VB in FIG. 5A.

The organic EL element of this example differs from that of Example 2 in that the light extraction structures 8 have a cone shape whose base has a radius of 3.5 μm, and the inclination angles $\phi_1$ and $\phi_2$ are both 30°. Other than these points, the organic EL element of this example is made of the same material as Example 2 and has the same configuration as Example 2. The simulation model of this example satisfies the above-described conditions of the present invention.

Comparative Example 1

Figure 6A:
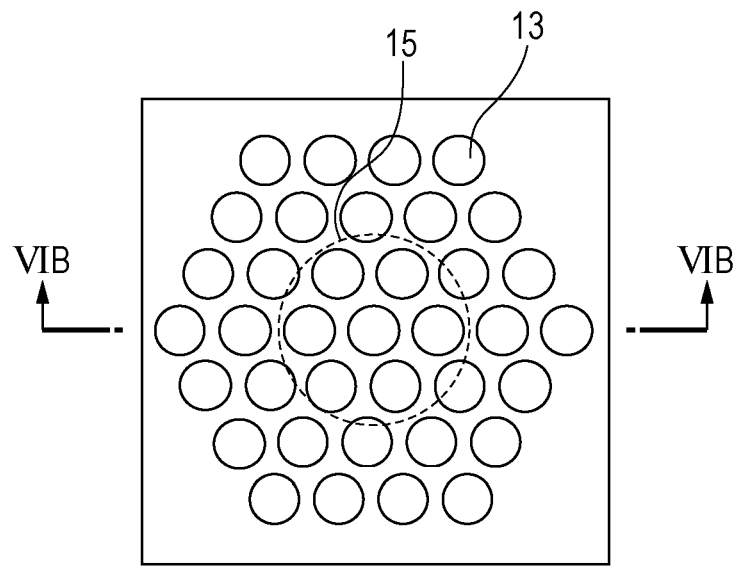
FIGS. 6A and 6B are schematic diagrams of an organic EL element according to Comparative Example 1.
Figure 6B:
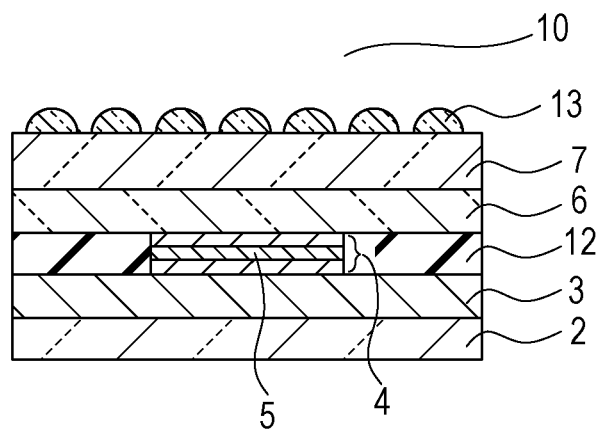

FIGS. 6A and 6B are schematic diagrams of an organic EL element of this comparative example. FIG. 6A is a schematic plan view of the organic EL element viewed from the front, and FIG. 6B is a schematic cross-sectional view of the organic EL element, taken along a plane including a line segment VIB in FIG. 6A.

The organic EL element of this comparative example differs from that of Example 2 in that semi-spherical lenses 13 are provided on the outer surface side of the transparent layer 7, instead of the light extraction structures 8. Other than this point, the organic EL element of this example is made of the same material as Example 2 and has the same configuration as Example 2. The simulation model of this comparative example does not satisfy the above-described conditions of the present invention. The details of the lens 13 of this comparative example are as follows:

The lenses 13 have a semi-spherical shape with a radius of 3.5 μm, and have a refractive index of 1.85 and an absorption of 1%/μm.

Comparative Example 2

The organic EL element of this comparative example differs from that of Example 2 in that the light extraction structures 8 are not provided on the outer surface side of the transparent layer 7. Other than this point, the organic EL element of this example is made of the same material as Example 2 and has the same configuration as Example 2. The simulation model of this comparative example does not satisfy the above-described conditions of the present invention.

Example 4

The organic EL element of this example differs from that of Example 3 in that the inclination angles $\phi_1$ and $\phi_2$ of the light extraction structures 8 are both 25°. Other than this point, the organic EL element of this example is made of the same material as Example 3 and has the same configuration as Example 3. The simulation model of this example satisfies the above-described conditions of the present invention.

Comparative Example 3

The organic EL element of this comparative example differs from that of Example 3 in that the inclination angles $\phi_1$ and $\phi_2$ of the light extraction structures 8 are both 20°. Other than this point, the organic EL element of this example is made of the same material as Example 3 and has the same configuration as Example 3. The simulation model of this comparative example does not satisfy the above-described conditions of the present invention.

Comparative Example 4

The organic EL element of this comparative example differs from that of Example 3 in that the inclination angles $\phi_1$ and $\phi_2$ of the light extraction structures 8 are both 35°. Other than this point, the organic EL element of this example is made of the same material as Example 3 and has the same configuration as Example 3. The simulation model of this comparative example does not satisfy the above-described conditions of the present invention.

Comparative Example 5

The organic EL element of this comparative example differs from that of Example 3 in that the inclination angles $\phi_1$ and $\phi_2$ of the light extraction structures 8 are both 45°. Other than this point, the organic EL element of this example is made of the same material as Example 3 and has the same configuration as Example 3. The simulation model of this comparative example does not satisfy the above-described conditions of the present invention.

Comparative Example 6

The organic EL element of this comparative example differs from that of Example 3 in that the transparent layer 7 has a refractive index of 1.50, the light extraction structures 8 have a refractive index of 1.50, and the inclination angles $\phi_1$ and $\phi_2$ are both 20°. Other than these points, the organic EL element of this example is made of the same material as Example 3 and has the same configuration as Example 3. The simulation model of this comparative example does not satisfy the above-described conditions of the present invention.

Comparative Example 7

The organic EL element of this comparative example differs from that of Comparative Example 6 in that the inclination angles $\phi_1$ and $\phi_2$ of the light extraction structures 8 are both 25°. Other than this point, the organic EL element of this example is made of the same material as Comparative Example 6 and has the same configuration as Comparative Example 6. The simulation model of this comparative example does not satisfy the above-described conditions of the present invention.

Comparative Example 8

The organic EL element of this comparative example differs from that of Comparative Example 6 in that the inclination angles $\phi_1$ and $\phi_2$ of the light extraction structures 8 are both 30°. Other than this point, the organic EL element of this example is made of the same material as Comparative Example 6 and has the same configuration as Comparative Example 6. The simulation model of this comparative example does not satisfy the above-described conditions of the present invention.

Comparative Example 9

The organic EL element of this comparative example differs from that of Comparative Example 6 in that the inclination angles $\phi_1$ and $\phi_2$ of the light extraction structures 8 are both 35°. Other than this point, the organic EL element of this example is made of the same material as Comparative Example 6 and has the same configuration as Comparative Example 6. The simulation model of this comparative example does not satisfy the above-described conditions of the present invention.

Comparative Example 10

The organic EL element of this comparative example differs from that of Comparative Example 6 in that the inclination angles $\phi_1$ and $\phi_2$ of the light extraction structures 8 are both 45°. Other than this point, the organic EL element of this example is made of the same material as Comparative Example 6 and has the same configuration as Comparative Example 6. The simulation model of this comparative example does not satisfy the above-described conditions of the present invention.

Comparative Example 11

The organic EL element of this comparative example differs from that of Comparative Example 6 in that the light extraction structures 8 are not provided on the outer surface side of the transparent layer 7. Other than this point, the organic EL element of this example is made of the same material as Comparative Example 6 and has the same configuration as Comparative Example 6. The simulation model of this comparative example does not satisfy the above-described conditions of the present invention.

Example 5

Figure 7A:
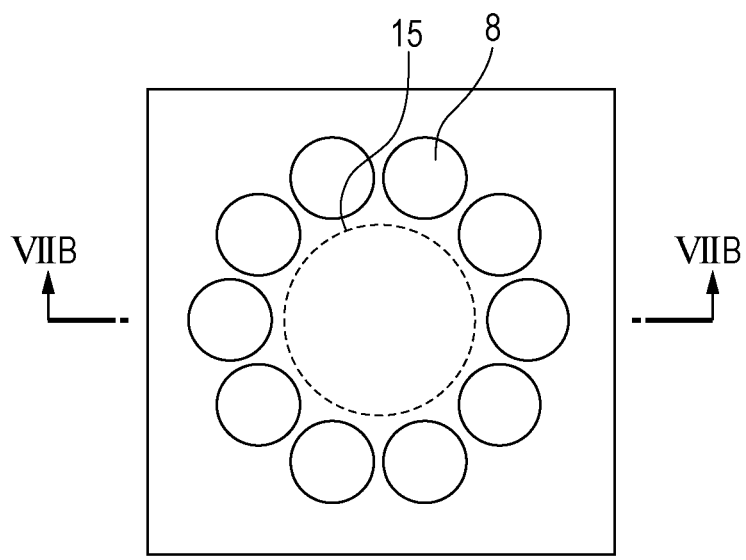
FIGS. 7A and 7B are schematic diagrams of an organic EL element of Example 5.
Figure 7B:
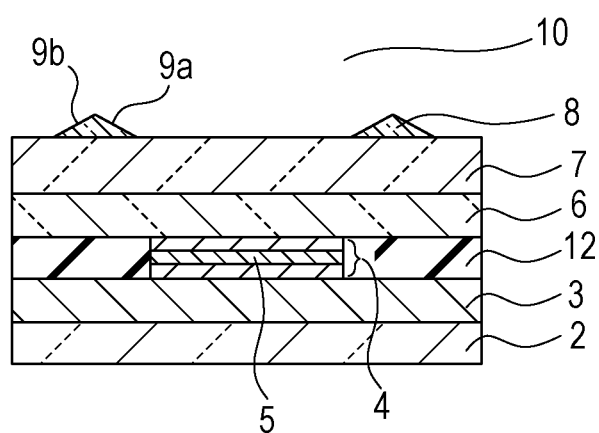

FIGS. 7A and 7B are schematic diagrams of an organic EL element of this example. FIG. 7A is a schematic plan view of the organic EL element viewed from the front, and FIG. 7B is a schematic cross-sectional view of the organic EL element, taken along a plane including a line segment VIIB in FIG. 7A.

The organic EL element of this example differs from that of Example 2 in the light extraction structures 8. Other than this point, the organic EL element of this example is made of the same material as Example 2 and has the same configuration as Example 2. The simulation model of this example satisfies the above-described conditions of the present invention. The details of the light extraction structures 8 of this example are as follows:

The light extraction structures 8 each have a conical shape with a radius of 5.75 μm, and have a refractive index of 1.85, an absorption of 1%/μm, an inclination angle $\phi_1$ of 30°, and an inclination angle $\phi_2$ of 30°. As shown in FIGS. 7A and 7B, ten light extraction structures 8 are provided around the outer periphery of the light-emitting region, in a circle, not on the light-exiting side of the light-emitting region.

Example 6

Figure 8A:
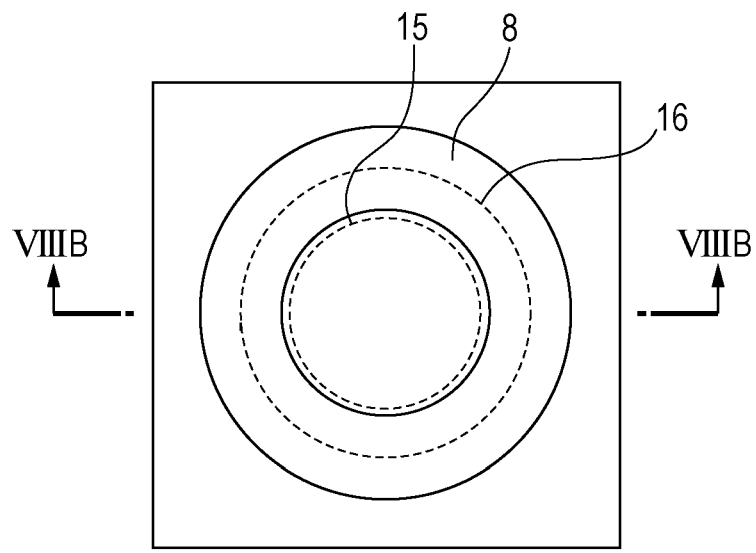
FIGS. 8A and 8B are schematic diagrams of an organic EL element of Examples 6 and 7.
Figure 8B:
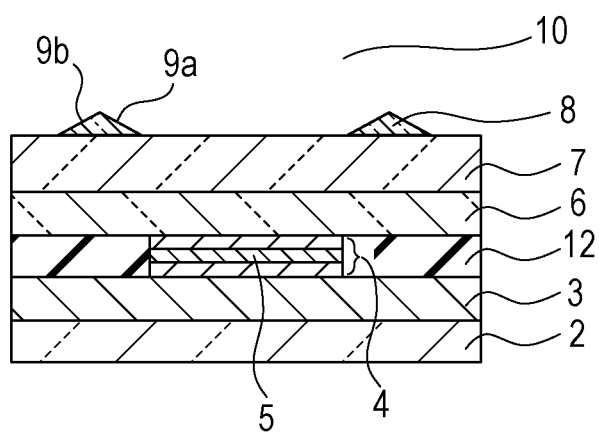

FIGS. 8A and 8B are schematic diagrams of an organic EL element of this example. FIG. 8A is a schematic plan view of the organic EL element viewed from the front, and FIG. 8B is a schematic cross-sectional view of the organic EL element, taken along a plane including a line segment VIIIB in FIG. 8A.

The organic EL element of this example differs from that of Example 2 in the light extraction structure 8. Other than this point, the organic EL element of this example is made of the same material as Example 2 and has the same configuration as Example 2. The simulation model of this example satisfies the above-described conditions of the present invention. The details of the light extraction structure 8 of this example are as follows:

As shown in FIGS. 8A and 8B, the light extraction structure 8 has a ring shape surrounding the outer periphery of the light-emitting region and is not provided on the light-exiting side of the light-emitting region. The light extraction structure 8 has a refractive index of 1.85, and an absorption of 1%/μm. The light extraction structure 8 has a ridge 16 where the height of the light extraction structure 8 is the largest, and the center of the ridge 16 and the center of the light-emitting region are aligned. The height of the light extraction structure 8 gradually decreases from the ridge 16 toward the inner periphery and the outer periphery. The inner peripheral portion of the ridge 16 constitutes the inclined portion $\phi_1$, and the outer peripheral portion of the ridge 16 constitutes the inclined portion $\phi_2$. The width of the base in the cross section where the inclination angles $\phi_1$ and $\phi_2$ are the largest is 11.5 μm. The inclination angle $\phi_1$ is 30°, and the inclination angle $\phi_2$ is 30°

Example 7

The organic EL element of this example differs from that of Example 6 in that the light extraction structure 8 has an inclination angle $\phi_1$ of 20°. Other than this point, the organic EL element of this example is made of the same material as Example 6 and has the same configuration as Example 6. The simulation model of this example satisfies the above-described conditions of the present invention.

Simulation Results

Table 1 shows the simulation results of Examples 1 to 7 and Comparative Examples 1 to 11. Table 1 shows the proportions of the front emission intensity and the efficiency of extracting light to the outside to Comparative Example 2, in which no light extraction structure 8 is provided. Referring to Table 1, comparison and evaluation of the simulation results will be performed.

TABLE 3

| | SHAPE OF LIGHT EXTRACTION STRUCTURE | REFRACTIVE INDEX OF LIGHT EXTRACTION STRUCTURE | INCLINATION ANGLE OF INCLINED PORTION 9a | INCLINATION ANGLE OF INCLINED PORTION 9b | EMISSION INTENSITY IN FRONT DIRECTION (RELATIVE TO COMPARATIVE EXAMPLE 2) | EFFICIENCY OF EXTRACTING LIGHT TO OUTSIDE (RELATIVE TO COMPARATIVE EXAMPLE 2) |
|---|---|---|---|---|---|---|
| EXAMPLE 1 | PRISM | 1.95 | 25° | 25° | 2.2 | 1.7 |
| EXAMPLE 2 | SQUARE PYRAMID | 1.85 | 25° | 25° | 2.4 | 2.2 |

TABLE 3-continued

| | SHAPE OF LIGHT EXTRACTION STRUCTURE | REFRACTIVE INDEX OF LIGHT EXTRACTION STRUCTURE | INCLINATION ANGLE OF INCLINED PORTION 9a | INCLINATION ANGLE OF INCLINED PORTION 9b | EMISSION INTENSITY IN FRONT DIRECTION (RELATIVE TO COMPARATIVE EXAMPLE 2) | EFFICIENCY OF EXTRACTING LIGHT TO OUTSIDE (RELATIVE TO COMPARATIVE EXAMPLE 2) |
|---|---|---|---|---|---|---|
| EXAMPLE 3 | CONE | 1.85 | 30° | 30° | 2.0 | 2.0 |
| COMPARATIVE EXAMPLE 1 | SEMI-SPHERICAL LENS | 1.85 | — | — | 0.9 | 2.2 |
| COMPARATIVE EXAMPLE 2 | NONE | — | — | — | 1 | 1 |
| EXAMPLE 4 | CONE | 1.85 | 25° | 25° | 2.3 | 1.8 |
| COMPARATIVE EXAMPLE 3 | CONE | 1.85 | 20° | 20° | 1.1 | 1.6 |
| COMPARATIVE EXAMPLE 4 | CONE | 1.85 | 35° | 35° | 1.3 | 1.9 |
| COMPARATIVE EXAMPLE 5 | CONE | 1.85 | 45° | 45° | 1.1 | 1.8 |
| COMPARATIVE EXAMPLE 6 | CONE | 1.50 | 20° | 20° | 0.9 | 1.2 |
| COMPARATIVE EXAMPLE 7 | CONE | 1.50 | 25° | 25° | 1.0 | 1.3 |
| COMPARATIVE EXAMPLE 8 | CONE | 1.50 | 30° | 30° | 1.3 | 1.3 |
| COMPARATIVE EXAMPLE 9 | CONE | 1.50 | 35° | 35° | 1.4 | 1.3 |
| COMPARATIVE EXAMPLE 10 | CONE | 1.50 | 45° | 45° | 1.2 | 1.3 |
| COMPARATIVE EXAMPLE 11 | NONE | — | — | — | 1.0 | 1.0 |
| EXAMPLE 5 | CONE | 1.85 | 30° | 30° | 1.6 | 1.5 |
| EXAMPLE 6 | RING | 1.85 | 30° | 30° | 3.1 | 2.3 |
| EXAMPLE 7 | RING | 1.85 | 20° | 30° | 3.5 | 2.2 |

Comparison and Evaluation of Simulation Results of Examples 1 to 3 and Comparative Examples 1 and 2

In Example 1, the front emission intensity has significantly increased to 2.2 times that of Comparative Example 2. In Example 1, the efficiency of extracting light to the outside has also significantly increased to 1.7 times that of Comparative Example 2. In Example 2, the front emission intensity has significantly increased to 2.4 times that of Comparative Example. In Example 3, the front emission intensity has significantly increased to 2.0 times that of Comparative Example 2.

On the other hand, in Comparative Example 1, although the efficiency of extracting light to the outside has significantly increased to 2.2 times that of Comparative Example 2, the front emission intensity has decreased to 0.9 times that of Comparative Example 2. Thus, the semi-spherical lenses cannot increase the front the emission intensity.

Thus, even if the light extraction structure 8 has a different shape, the organic EL element of the present invention can increase the front emission intensity, as long as the above-described conditions of the present invention are satisfied, as in the cases of Example 1 to 3.

Comparison and Evaluation of Simulation Results of Examples 3 and 4 and Comparative Examples 2 to 11

Figure 9:
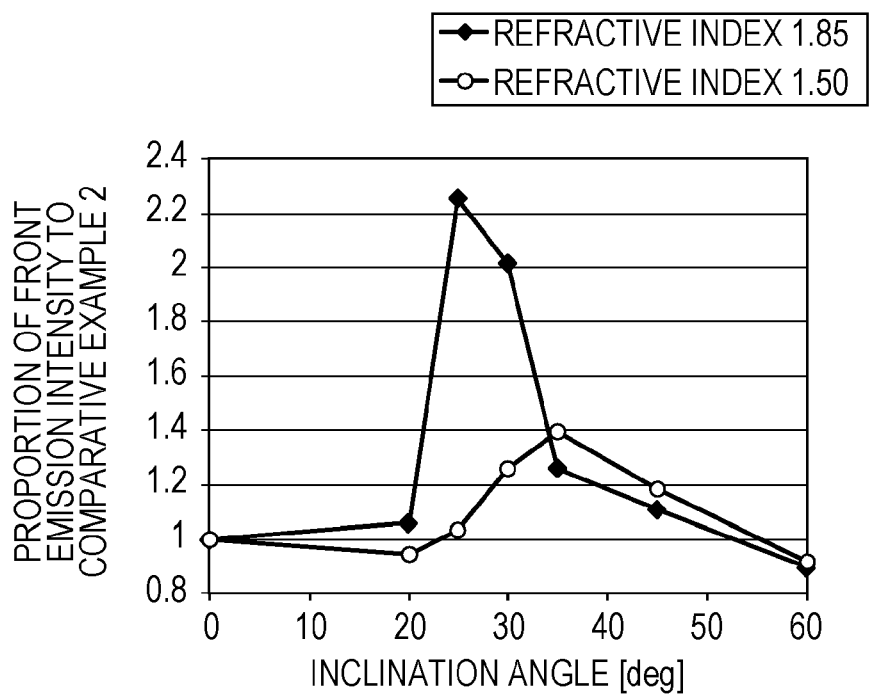
FIG. 9 is a graph showing the relationship between the inclination angle and the proportion of front emission intensity to Comparative Example 2.
Figure 10:
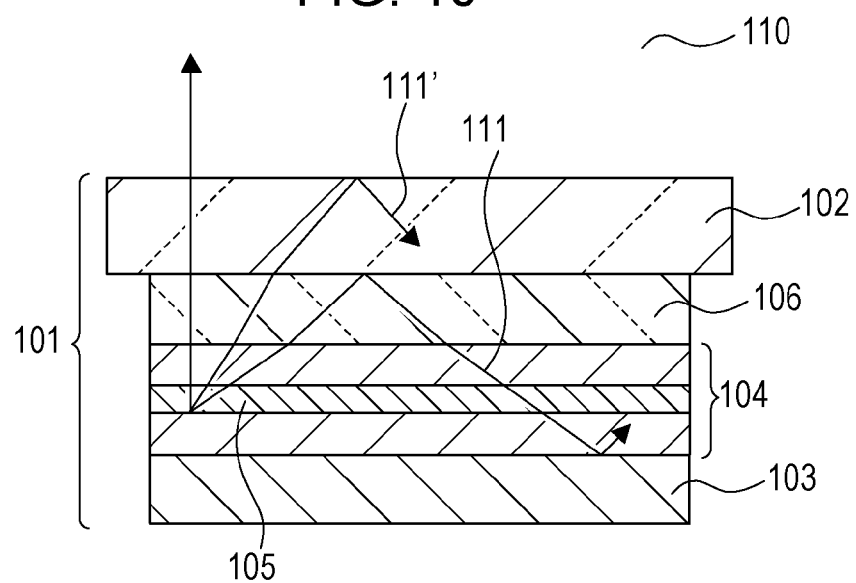
FIG. 10 is a schematic cross-sectional view of an organic EL element of the related art.

FIG. 9 is a graph showing the relationship between the inclination angles $\phi_1$ and $\phi_2$ of the light extraction structure 8 and the proportion of the front emission intensity, in the simulation results of Examples 3 and 4 and Comparative Examples 2 to 11 in Table 1.

In Examples 3 and 4 and Comparative Examples 2 to 5, the transparent layer 7 and the light extraction structures 8 have a refractive index of 1.85. The inclination angles $\phi_1$ and $\phi_2$ are 0° in Comparative Example 2, since no light extraction structure 8 is provided. As shown in FIG. 9, in Examples 3 and 4, the front emission intensity has increased to at least 2 times that of Comparative Example 2. If the light extraction structures 8 have a refractive index of 1.85, the inclination angles $\phi_1$ and $\phi_2$ that satisfy Condition 1 or 2 are in the range of 24° to 32°. Because the inclination angles $\phi_1$ and $\phi_2$ in Examples 4 and 5 are 30° and 25°, respectively, the organic EL element of the present invention can increase the front emission intensity. On the other hand, in Comparative Examples 3 to 5, the front emission intensity is low, namely, 1.1 to 1.3 times that of Comparative Example 2. Thus, the organic EL element of the present invention can drastically increase the front emission intensity by satisfying the above-described conditions of the present invention.

In Comparative Examples 6 to 11, the transparent layer 7 and the light extraction structures 8 have a refractive index of 1.50. The inclination angles $\phi_1$ and $\phi_2$ are 0° in Comparative Example 11, since no light extraction structure 8 is provided. Although the front emission intensity is the largest when the inclination angles $\phi_1$ and $\phi_2$ are 35°, as in Comparative Example 9, the value is still 1.4 times that of Comparative Example 2, which is lower than the values in Examples 3 and 4. This is because a portion of the guided wave light 11 is totally internally reflected at the interface between the transparent electrode 6 and the transparent layer 7, since the transparent layer 7 has a lower refractive index than the light-emitting layer 5, as described above. Thus, the light incident on the light extraction structures 8 decreases, and, in Comparative Examples 6 to 11, the front emission intensities are low, namely, 0.9 to 1.4 times that of Comparative Example 2.

As has been described above, not only the inclination angles $\phi_1$ and $\phi_2$ of the light extraction structures 8, but also the refractive indices of the organic EL element of the present invention, need to satisfy Condition 1 or 2.

Comparison and Evaluation of Simulation Results of Examples 5 to 7 and Comparative Example 2

In Example 5, the front emission intensity has increased to 1.6 times that of Comparative Example 2. As shown, by providing the light extraction structures 8 around the outer periphery of the light-emitting region, not on the outer surface side of the transparent layer 7 in the light-emitting region, the front emission intensity can be increased. This is because the organic EL element of the present invention is characterized in that the guided wave light 11 is extracted in the front direction. In Example 6, the front emission intensity has significantly increased to 3.1 times that of Comparative Example 2. This significant increase in the front emission intensity may be explained by the provision of the light extraction structure 8 so as to surround the outer periphery of the light-emitting region, which makes the guided wave light 11 more likely to be incident on the light extraction structure 8, thereby increasing the front emission intensity. In Example 7, the front emission intensity has even more significantly increased to 3.5 times that of Comparative Example 2. This result shows that the inclination angles $\phi_1$ and $\phi_2$ do not necessarily have to be the same value, if the light extraction structure 8 is provided outside the light-emitting region.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-107385 filed May 12, 2011 and No. 2012-087102 filed Apr. 6, 2012, which are hereby incorporated by reference herein in their entirety.

What is claimed is:

1. An organic EL element comprising:
   an organic EL layer including a transparent electrode, a reflective electrode, and a light-emitting layer disposed between the transparent electrode and the reflective electrode;
   a transparent layer disposed on a light-exiting side of the transparent electrode; and
   a light extraction structure disposed on a light-exiting side of the transparent layer and having a protruding shape with inclined portions that are gradually narrowing from the transparent layer side,
   wherein the transparent layer and the light extraction structure have a larger refractive index than the light-emitting layer, and
   wherein the inclined portions of the light extraction structure are designed so as to satisfy at least one of Condition 1 and Condition 2 for extracting guided wave light emitted from the light-emitting layer and incident on the light extraction structure from the light extraction structure to the outside of the organic EL element, in a cross section taken along a plane perpendicular to the reflective electrode, where two inclination angles $\phi_1$ and $\phi_2$ formed between the reflective electrode and the inclined portions are the largest, wherein Condition 1 is given by $$\sin^{-1}\left(\frac{n_0}{n_1}\right) \leq \theta_1 \leq 90°,$$

$$n_1 \sin\theta_1 = n_2 \sin\theta_2,$$

$$\sin(\theta_2 + \phi_1) \geq \frac{n_0}{n_2},$$

$$\sin(180° - \theta_2 - 2\phi_1 - \phi_2) \geq \frac{n_0}{n_2},$$

$$-\frac{n_0}{n_2} < \sin(180° - \theta_2 - 2\phi_1 - 3\phi_2) < \frac{n_0}{n_2}, \text{ and}$$

$$\sin^{-1}\left(\frac{n_2}{n_0}\sin(180° - \theta_2 - 2\phi_1 - 3\phi_2)\right) + \phi_2 = 0,$$

and
Condition 2 is given by $$\sin^{-1}\left(\frac{n_0}{n_1}\right) \leq \theta_3 \leq 90°,$$

$$n_1 \sin\theta_3 = n_2 \sin\theta_4,$$

$$\sin(\theta_4 - \phi_2) \geq \frac{n_0}{n_2},$$

$$-\frac{n_0}{n_2} < \sin(\theta_4 - 3\phi_2) < \frac{n_0}{n_2}, \text{ and}$$

$$\sin^{-1}\left(\frac{n_2}{n_0}\sin(\theta_4 - 3\phi_2)\right) + \phi_2 = 0,$$

wherein $n_0$ denotes the refractive index of the outer area of the organic EL element, $n_1$ denotes the refractive index of the light-emitting layer, $n_2$ denotes the refractive index of the light extraction structure, $\theta_1$ and $\theta_3$ denote the angles formed between the guided wave light and the normal to the reflective electrode in the light-emitting layer, and $\theta_2$ and $\theta_4$ denote the angles formed between the guided wave light and the normal to the reflective electrode in the light extraction structure.

2. The organic EL element according to claim 1, wherein the light extraction structure is provided only outside a light-emitting region.

3. The organic EL element according to claim 2, wherein the light extraction structure is provided so as to surround an outer periphery of the light-emitting region.

4. The organic EL element according to claim 2, wherein the two inclination angles $\phi_1$ and $\phi_2$ are different.

5. The organic EL element according to claim 1, wherein the light extraction structure is provided at least on a light-emitting region, and the two inclination angles $\phi_1$ and $\phi_2$ are equal.

6. The organic EL element according to claim 5, wherein the inclination angles $\phi_1$ and $\phi_2$ are in the range of 22° to 32°.

7. The organic EL element according to claim 5, wherein the inclination angles $\phi_1$ and $\phi_2$ are in the range of 25° to 28°.

8. The organic EL element according to claim 4, wherein the inclination angle $\phi_2$ farther from the light-emitting region is in the range of 24° to 32°, and the inclination angle $\phi_1$ closer to the light-emitting region is in the range of 11° to 45°.

9. The organic EL element according to claim 4, wherein the inclination angle $\phi_2$ farther from the light-emitting region is in the range of 24° to 30°, and the inclination angle $\phi_1$ closer to the light-emitting region is in the range of 16° to 45°.

10. The organic EL element according to claim 4, wherein the inclination angle $\phi_2$ farther from the light-emitting region is in the range of 24° to 28°, and the inclination angle $\phi_1$ closer to the light-emitting region is in the range of 20° to 45°.

11. The organic EL element according to claim 4, wherein the inclination angle $\phi_2$ farther from the light-emitting region is in the range of 24° to 26°, and the inclination angle $\phi_1$ closer to the light-emitting region is in the range of 25° to 45°.

12. The organic EL element according to claim 4, wherein the inclination angle $\phi_2$ farther from the light-emitting region is in the range of 26° to 32°, and the inclination angle $\phi_1$ closer to the light-emitting region is in the range of 11° to 42°.

13. The organic EL element according to claim 4, wherein the inclination angle $\phi_2$ farther from the light-emitting region is in the range of 26° to 30°, and the inclination angle $\phi_1$ closer to the light-emitting region is in the range of 16° to 42°.

14. The organic EL element according to claim 4, wherein the inclination angle $\phi_2$ farther from the light-emitting region is in the range of 26° to 28°, and the inclination angle $\phi_1$ closer to the light-emitting region is in the range of 20° to 42°.

15. The organic EL element according to claim 4, wherein the inclination angle $\phi_2$ farther from the light-emitting region is in the range of 28° to 32°, and the inclination angle $\phi_1$ closer to the light-emitting region is in the range of 11° to 39°.

16. The organic EL element according to claim 4, wherein the inclination angle $\phi_2$ farther from the light-emitting region is in the range of 28° to 30°, and the inclination angle $\phi_1$ closer to the light-emitting region is in the range of 16° to 39°.

17. The organic EL element according to claim 4, wherein the inclination angle $\phi_2$ farther from the light-emitting region is in the range of 30° to 32°, and the inclination angle $\phi_1$ closer to the light-emitting region is in the range of 11° to 36°.

18. An image pickup apparatus comprising the organic EL element according to claim 1 and an image pickup device.

19. A display apparatus comprising a plurality of the organic EL elements according to claim 1.

20. An image forming apparatus comprising the organic EL element according to claim 1 and a photosensitive body exposed by the organic EL element.

* * * * *